United States Patent
Nelson

(10) Patent No.: US 8,009,709 B2
(45) Date of Patent: Aug. 30, 2011

(54) DC COUPLED DRIVER WITH ACTIVE TERMINATION

(75) Inventor: David A. Nelson, Fort Collins, CO (US)

(73) Assignee: JDS Uniphase Corporation, Milpitas, CA (US)

( * ) Notice: Subject to any disclaimer, the term of this patent is extended or adjusted under 35 U.S.C. 154(b) by 54 days.

(21) Appl. No.: 12/430,491

(22) Filed: Apr. 27, 2009

(65) Prior Publication Data

US 2009/0268767 A1    Oct. 29, 2009

Related U.S. Application Data

(60) Provisional application No. 61/047,981, filed on Apr. 25, 2008, provisional application No. 61/104,480, filed on Oct. 10, 2008.

(51) Int. Cl.
  *H01S 3/00* (2006.01)
(52) U.S. Cl. .......... 372/38.02; 372/38.07; 372/38.1
(58) Field of Classification Search ............ 372/38.02, 372/38.07, 38.1
  See application file for complete search history.

(56) References Cited

U.S. PATENT DOCUMENTS

| | | | |
|---|---|---|---|
| 5,796,767 A | 8/1998 | Aizawa | 372/38.02 |
| 6,067,307 A | 5/2000 | Krishnamoorthy | 372/38.02 |
| 6,272,160 B1 | 8/2001 | Stronczer | 372/38.02 |
| 6,389,050 B2 | 5/2002 | Stronczer | 372/38.02 |
| 6,563,274 B2 | 5/2003 | Suzuki et al. | 315/291 |
| 6,618,406 B1 | 9/2003 | Kaminishi | 372/38.02 |
| 6,667,661 B1 | 12/2003 | Liu et al. | 330/311 |
| 6,744,795 B2 | 6/2004 | Magoon | 372/38.02 |
| 6,765,942 B2 | 7/2004 | Robertson | 372/38.02 |
| 6,778,569 B2 | 8/2004 | Fischer | 372/38.02 |
| 6,778,571 B2 | 8/2004 | Vaughan | 372/38.1 |
| 6,792,019 B2 | 9/2004 | Fattaruso | 372/38.07 |
| 6,850,546 B2 | 2/2005 | Vaughan | 372/38.02 |
| 6,965,722 B1 | 11/2005 | Nguyen | 385/147 |
| 6,980,575 B1 | 12/2005 | Rohilla | 372/38.02 |
| 7,145,929 B2 | 12/2006 | Bergmann et al. | 372/38.02 |
| 7,193,463 B2 | 3/2007 | Miyashita et al. | 330/252 |
| 7,227,246 B2 | 6/2007 | Mahowald | 257/678 |
| 2005/0195870 A1* | 9/2005 | Moran | 372/38.02 |
| 2007/0008665 A1 | 1/2007 | Moyer et al. | 361/42 |
| 2008/0002988 A1 | 1/2008 | Cheng et al. | 398/182 |

FOREIGN PATENT DOCUMENTS

EP    1445843    8/2004

OTHER PUBLICATIONS

Ransijn H, Salvador G, Daugherty DD, Gaynor KD , "A 10-Gb/s laserlmodulator driver IC with a dual-mode actively, matched output buffer", IEEE Journal of Solid-State Circuits, vol. 36 Issue: 9, pp. 1314-1320, Sep 2001.
European Search Report, European Appln. No. 09158844.2, Jun. 25, 2009.

* cited by examiner

*Primary Examiner* — Kinam Park
(74) *Attorney, Agent, or Firm* — Matthew A. Pequignot; Pequignot + Myers LLC

(57) ABSTRACT

A DC coupled driver is described for modulating a vertical cavity surface emitting laser at high speeds with active termination. High speed and low total power dissipation is achieved by improving the driver immunity to pulse reflections, which can arise due to impedance mismatch between the driver output impedance and the VCSEL impedance. The rise and fall times of the driver may be adjusted for particular applications. The driver may be fabricated using a choice of bipolar, NMOS and PMOS technologies.

6 Claims, 12 Drawing Sheets

DC COUPLED DRIVER WITH ACTIVE TERMINATION

CROSS-REFERENCE TO RELATED APPLICATIONS

The present invention claims priority from U.S. Patent Application No. 61/047,981 filed Apr. 25, 2008, entitled "DC Coupled Driver With Active Termination", by Nelson, and claims priority from U.S. Patent Application No. 61/104,480 filed Oct. 10, 2008, entitled "DC Coupled Driver With Active Termination", by Nelson, which are incorporated herein by reference for all purposes.

TECHNICAL FIELD

The present invention is directed to driver electronics, and more particularly, to integrated circuit drivers for opto-electronic emitters such as vertical cavity surface emitting lasers.

BACKGROUND OF THE INVENTION

In applications where optical signals are used to transmit data, such as fiber-optic communications systems, fast and efficient driver circuits are required for modulating the optical emission of optical transmitters such as laser diodes, light emitting diodes, vertical cavity surface emitting lasers, and similar opto-electronic devices. Where the modulation rates extend into regions where electrical reflections within interconnections between the driver circuitry and the driven optoelectronic device cannot be neglected, electrical terminations are often required.

A commonly used driver arrangement in prior art is a DC coupled driver 100 for driving a VCSEL D as shown in FIG. 1. It comprises a differential input npn bipolar transistor pair $q_3$ and $q_4$. Differential voltage inputs $v_{in}$ and $v_{ip}$ are connected to a base on the transistors $q_3$ and $q_4$ to excite collector currents $i_3$ and $i_4$, respectively. A supply voltage $V_{dd}$ is connected to a collector of the transistor $q_4$ and through a current source I to a collector of the transistor $q_3$. An anode of the VCSEL D receives a voltage $V_d$ at the collector of the transistor $q_3$ to produce a driving current $i_D$. A cathode of the VCSEL D is connected to a circuit ground. Emitters of the transistors $q_3$ and $q_4$ are also connected to the circuit ground, but through a current source 2M. There is no back-termination.

The output current range is I for a 'one' level and I–2M for a 'zero' level. This prior art driver has a power dissipation $$P_{diss}=V_{dd}*(I+M). \quad\quad \text{Equation [1a]}$$

This driver has a problem in that without the back termination the circuit is susceptible to signal degradation due to reflections resulting from wire-bonds which are typically used to provide a connection between the driver output $V_d$ and the load, VCSEL D. Even when the wire-bond length is held to small values like 1 mm or less, the reflection amplitude and delay can cause significant degradation in an eye diagram on the driver output $V_d$. To prevent this reflection from causing severe problems, the rise and fall time of the transistors $q_3$ and $q_4$ must be increased, thus precluding operation at very high modulation rates.

Another prior art driver 200 shown in FIG. 2 results when a passive termination resistor P is connected between the collectors of the transistors $q_3$ and $q_4$. For greatest effect, the value of the passive termination resistor P is adjusted to equal a VCSEL impedance, $z_D$. In addition, an upper current source 2M' is inserted between the collector of the transistor $q_4$ and the voltage supply $V_{dd}$. A by-pass capacitor $C_b$ is provided between the circuit ground and the collector of the transistor $q_4$.

In this circuit, the average bias in VCSEL D is set by the current source I, rather than the 'one' level. The 'one' level consists of a current (I+M) and 'zero' level consists of a current (I–M). While this circuit is fast and provides good eye quality, its power dissipation is higher than for the driver 100 in FIG. 1:

$$P_{diss}=V_{dd}*(I+2M). \quad\quad \text{Equation [1b]}$$

This driver circuit can maintain a nearly constant power supply current, with small transient spikes occurring at the data transitions.

However, it has a problem in that for a large current M and high VCSEL voltage or impedance, a typical 3.3V power supply voltage is insufficient, as too much voltage is dropped across the passive termination resistor P. That leaves too little voltage for the upper current source 2M' to operate properly when the VCSEL voltage is high.

Another drawback stems from difficulties in handling long consecutive identical digit (CID) data streams. Since node $V_r$ is supplied by a current source rather than a voltage source, its DC value can drift in the presence of CID. The most practical way to prevent this problem from being severe is to use large values of the by-pass capacitor $C_b$, but this is costly in terms of integrated circuit die area. Still, well designed circuits of this type may see 'one' or 'zero' levels shift by up to 10% in the presence of 50 CIDs.

To reduce the severity of this problem, the current source 2M can be augmented with a shunt amplifier to the circuit ground. However the DC value drift is reduced at the expense of higher power dissipation. A prior art driver 300 shown in FIG. 3 was designed to overcome the shortcomings of the driver 100 in FIG. 1 by removing constraints on the $V_{dd}$, as well as including an active back termination but with reduced power dissipation.

An additional differential bipolar transistor pair $q_5$, $q_6$ is driven by the same differential voltage inputs $v_{in}$ and $v_{ip}$ as the differential pair $q_3$, $q_4$, respectively, to create a voltage at node $V_3$ which tracks the voltage at $V_d$. The emitters of the transistors $q_5$, $q_6$ are connected to the circuit ground through an augmenting current source 2A. A unity gain follower $x_1$ buffers voltage $V_3$ and drives a resistor S, which provides the termination impedance. The value of the resistor S can be partially or fully provided by the inherent output impedance of unity gain follower $x_1$. The voltage generated across resistor T by current $i_5$ is chosen to track the voltage $V_d$ such that $V_3$ and $V_d$ track each other. Since $V_3$ and $V_d$ are ideally always equal, no current flows through the resistor S. A bias loop including a low speed operational amplifier U4 drives a gate of a PMOS FET $m_r$ to produce a voltage $V_r$ at a drain of the PMOS FET $m_r$ to ensure that the average current in S is near zero. The power dissipation of this circuit is:

$$P_{diss}=V_{dd}*(I+M+2A+i(x_1)), \quad\quad \text{Equation [1c]}$$

where $i(x_1)$ is the current drawn by unity gain follower $x_1$, I, M, 2A are currents in the current sources I, 2M, 2A and $V_{dd}$ is a power supply voltage.

This is typically higher than for driver 100 of FIG. 1 but less than for driver 200 of FIG. 2.

As in the other prior art, the supply current drawn by the driver 300 is not constant, so possibilities of cross-talk and electromagnetic interference exist. The headroom to supply voltage $V_{dd}$ is greater in this prior art driver 300 than that of the driver 200 in FIG. 2. Typically the voltage $V_r$ is higher than the voltage $V_d$ by a factor of T*A, which may be several hundred millivolts. Also, if the voltage difference $V_{dd}$-$V_r$ drops below several hundred millivolts, the PMOS FET $m_r$ will cease to function as a current source. Typically, these factors confine the supply voltage to $V_{dd}$>3V and the diode voltage to $V_d$<2.2V in the bipolar case, thereby limiting the operating range and selection of the VCSEL D, leading to a great loss in accuracy as these limits are neared and current sources start to saturate.

Another problem present in prior art driver 300 is that due to a group delay in the unity gain follower x1 and mismatched time constants at circuit nodes $V_3$ and $V_d$, the dynamic voltage at node $V_4$ always lags the voltage at node $V_d$. At 10 Gbps data rates with a 100 pS bit period, this lag, typically 10 ps, can be severe. It slows the rise and fall time at node $V_d$, since during slewing, the output drive current $i_D$ is stolen because the current in resistor S does not equal zero.

Another problem with the prior art driver 300 stems from the voltage $V_r$ being supplied from a current source comprising the PMOS FET $m_r$. Thus, if long CIDs are present in the input signal stream, the value of voltage $V_r$ will drift with a bias loop time constant. The only way to prevent this problem from being severe is to use large values of by-pass capacitor $C_b$, but this is costly in terms of die area. Nonetheless, well designed circuits of this type may see 'one' or 'zero' levels shift by up to 5% in the presence of 50 CIDs. A shunt voltage regulator can also be added in parallel with the current source to overcome this, but at the expense of increased power dissipation.

In FIG. 4 a further example of a prior art VCSEL driver 400 is shown, which possesses a very low power dissipation given by:

$$P_{diss}=V_{cc}*I_m+V_{dd}*I_b. \qquad \text{Equation [1d]}$$

Differential voltage inputs $v_{ip}$ and $v_{in}$ are each connected to a gate on a differential input NMOS field-effect transistor (FET) pair $m_p$ and $m_n$, respectively, each of whose drain is connected to a first supply voltage $V_{cc}$ through a load resistor $R_c$. Sources of the transistors $m_p$ and $m_n$ are connected together to a modulation current source $I_m$ working into the ground connection. The cathode of a diode D (such as a VCSEL) is connected to the drain of transistor $m_n$, while its anode is driven by a bias current source $I_b$ from a second supply voltage $V_{dd}$. The anode of the VCSEL D is AC grounded through a bypass capacitor $C_g$.

The differential voltage inputs $v_{ip}$ and $v_{in}$ are driven so as to switch all of current $I_m$ into the load resistor $R_c$ on the left or into the parallel combination of load resistor $R_c$ on the right and the VCSEL diode D. The average or bias current in diode D is just the upper current source current $I_b$. At high modulation rates, where the bypass capacitor $C_g$ acts like an AC short circuit, the current in diode D will be:

$$I_d=I_b\pm I_m*R_c/(z_D+R_c), \qquad \text{Equation [1e]}$$

where $z_D$ is the impedance of the diode D.

Baseline wander is a bias shift away from a statistical 50/50 'one' level to 'zero' level balance. Problems occur with the VCSEL driver 400 when data fed to inputs $v_{ip}$, $v_{in}$ does not maintain the 50/50 balance of 'one' level/'zero' in the long term, or where there are long sequences of CIDs that shift a DC balance over a relatively long period of time.

The time constant of this circuit is:

$$t_c=C_g*R_c\|z_D, \qquad \text{Equation [1f]}$$

where $\|$ denotes the parallel value of impedance formed by resistor $R_c$ and diode impedance $z_D$. Since this forms a single pole response, then for a constant $v_{ip}$-$v_{in}$ input voltage, the current through diode D will settle to the current $I_b$ from the starting point of $I_b\pm I_m*R_c/(z_D+R_c)$ after approximately 2.2 time constants. Consider an example where this VCSEL driver 400 is designed to operate at 10 Gbps.

Typically, to keep the baseline wander small, a design may specify that a low frequency −3 dB corner of the driver circuit 400 be less than 300 kHz. For the parallel value of impedance $R_c\|z_D$ equal to 70 ohm, the value of $C_g$ required to achieve this is:

$$C_g=1/((R_c\|z_D)*2\pi*300\text{ kHz})=7.6\text{ nF}. \qquad \text{Equation [1g]}$$

This amount of capacitance is much larger than a reasonable amount of capacitance available in a typical integrated circuit process. In many applications it is not feasible to use an off-chip capacitor because of the parasitics encountered in going off chip, or because there is no room for such a capacitor. Hence the 300 kHz low frequency corner cannot be achieved, and this circuit would not be usable for 10 Gbps or lower data rates where $2^{31}$−1 pseudo-random bit sequence (PRBS) data is present.

If, for example, even the large value of 0.1 nF of on-chip capacitance could be provided for $C_g$, then the time constant of this circuit would be 0.1 nF*70 ohms=7 ns. If the input data were a $2^{31}$−1 PRBS, where 31 CIDs are occasionally encountered, then such a CID event would last about 3.1 ns. In that amount of time the DC value of the current in diode D can shift by nearly 10%.

Additionally, the worst case imbalance occurs when the running digital sum reaches its maximum, in which case the DC shift is even greater. This amount of DC shift, or baseline wander could not be tolerated in a VCSEL driver application.

A final prior art common anode VCSEL driver 500 is shown in FIG. 5. The magnitude of the differential driving voltage $|v_{ip}$-$v_{in}|$ should be large enough to allow complete switching of the modulation current $i_m$ between transistors $m_p$ and $m_n$. The anode of the VCSEL diode D is connected to a positive supply voltage $V_{dd}$, while its cathode is biased by a bias current source $i_z$ from the circuit ground so that a minimum of the diode current $i_D$, or 'zero' level current is provided just above a threshold of the VCSEL diode D. When the input $v_{ip}$ sufficiently exceeds the voltage at input $v_{in}$, all of the modulation current $i_m$ is switched through transistor $m_p$, increasing the diode current $i_D$ to $i_m+i_z=i_o$, or the 'one' level current.

When $v_{in}$ exceeds $v_{ip}$ and current $i_m$ is switched through transistor mn, then the VCSEL current $i_D=i_z$. The VCSEL forward voltage drop typically ranges from 1.6 V at currents just above threshold to 2.2 V at higher currents typical of the one level current. Therefore, to allow approximately 1 V at the drain of transistor $m_p$, $V_{dd}$ will typically be 3V or greater. $V_{cc}$ may be equal to $V_{dd}$, or it could be lower, around 1 V, to reduce power dissipation and prevent large $V_{ds}$ at transistor $m_n$. Under typical conditions where the duty cycle of $v_{ip}$ and $v_{in}$ is 50%, the power dissipation of the driver 500 is given by Equation 1h, which is typically the lowest power dissipation of any type of VCSEL driver.

$$P_{diss}=0.5*i_m*(V_{cc}+V_{dd})+i_z*V_{dd} \qquad \text{Equation [1h]}$$

This type of circuit 500 is also capable of operation at very high data rates. At data rates greater than 10 Gbps it is very important that the distance between the driver circuitry, typically located on an integrated circuit, be very close to the VCSEL diode which is separate from the driver integrated circuit and connected to it by means of a wire-bond or printed circuit trace on a printed circuit board. Keeping this distance short is important to ensure that reflections caused by impedance mismatches between the high output impedance of the VCSEL driver and the much lower impedance of the VCSEL can be attenuated quickly. If the distance between the two is large, then the reflections from the impedance mismatches will reverberate back and forth between the two ends of the wire-bond or printed circuit trace for long periods of time, potentially interfering with subsequent data values.

A DC coupled driver for driving an optoelectronic emitter such as a vertical cavity surface emitting laser (VCSEL) is presented, which overcomes the shortcomings of the described prior art.

It is an object of the invention to provide a DC-coupled driver for high speed modulation of a VCSEL with improved immunity to pulse reflections in the interconnect between the driver and the VCSEL by incorporating an active termination.

A further object of the invention is to define different integrated circuit technologies for the DC-coupled driver, which are suitable for large scale manufacturing, including npn bipolar transistor and CMOS (NMOS and PMOS) technologies.

Another object of the invention is to achieve a low total power dissipation for the driver.

Provision is also made for using the active termination to control rise and fall times of the driver by adding a time delayed component of the input signal.

SUMMARY OF THE INVENTION

A DC-coupled driver for a vertical cavity surface emitting laser (VCSEL) diode incorporating a differential input stage for receiving data and complementary data signals from a signal source. A termination resistor is directly connected to the VCSEL diode and to a current source for actively controlling a voltage on the VCSEL diode.

BRIEF DESCRIPTION OF THE DRAWINGS

The invention will be described in greater detail with reference to the accompanying drawings which represent preferred embodiments thereof, wherein.

DETAILED DESCRIPTION

A DC coupled driver for driving an optoelectronic emitter such as a VCSEL is presented, which overcomes the shortcomings of the described prior art. Having both accuracy and low power consumption, it well suited for very high speed data rates due to the incorporation of an active back termination.

Figure 6:
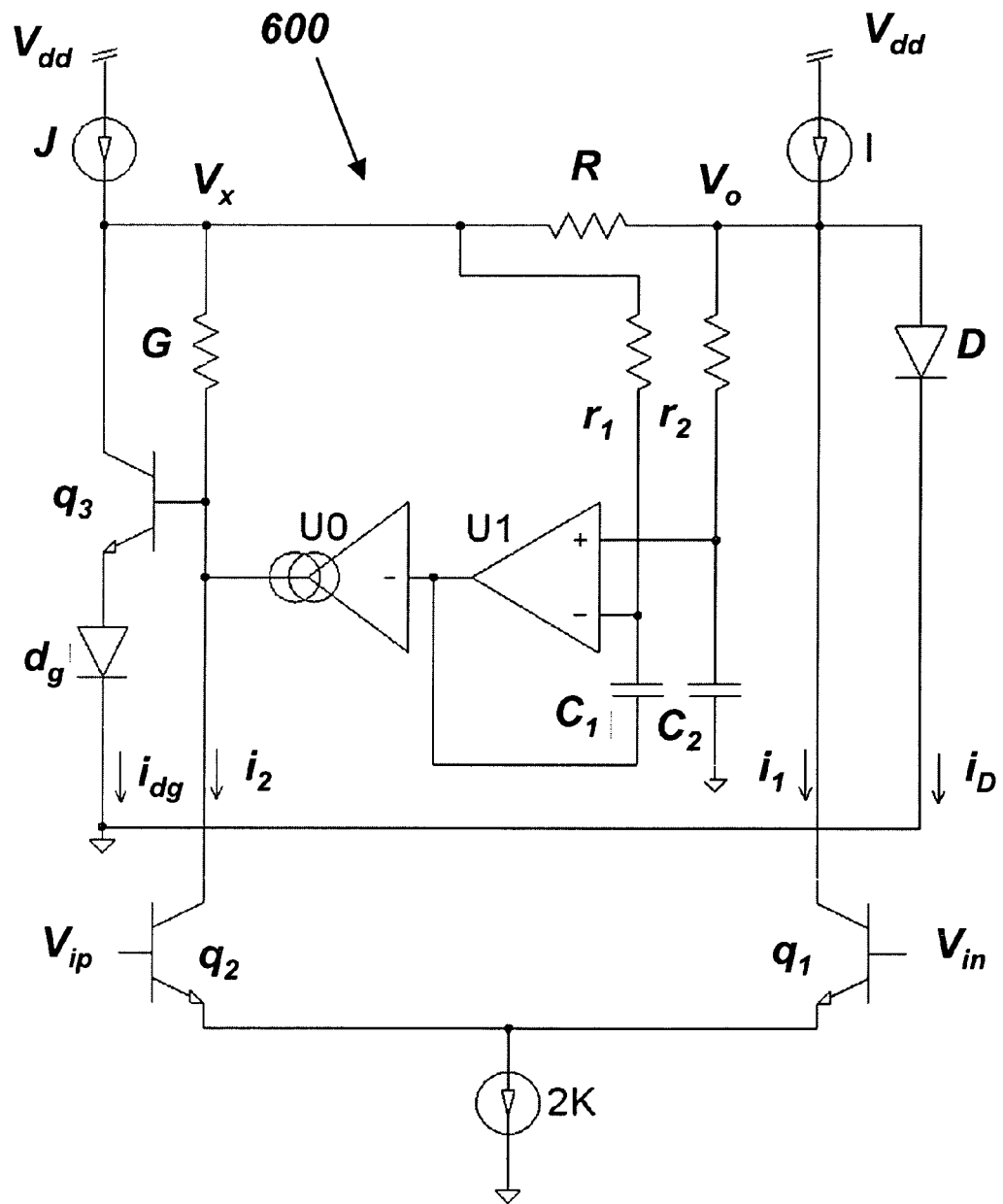
FIG. 6 is the circuit of a bipolar VCSEL driver with a termination according the a first embodiment of the invention.

Referring to FIG. 6 where a first embodiment is shown, a differential input amplifier 600 comprises a differential input npn bipolar transistor pair $q_1$ and $q_2$ with differential voltage inputs $v_{in}$ and $v_{ip}$ applied to each base of the transistors $q_1$ and $q_2$, respectively. The peak to peak differential signal amplitude of $v_{in}$ and $v_{ip}$ should be large enough to completely switch a current from one side of the differential pair to the other.

A supply voltage rail with a voltage $V_{dd}$ provides electrical power to the differential input amplifier 600 through current sources I and J to each collector of the transistors $q_1$ and $q_2$, respectively. At a circuit node $V_o$ the current source I is connected to a collector of the transistor $q_1$ and to an anode of a diode D, which may be a vertical cavity surface-emitting laser (VCSEL) diode, for instance. A cathode of the diode D is connected to a circuit ground.

At a circuit node $V_x$ the current source J is connected to a collector of a transistor $q_3$ and to one terminal of a feedback resistor G. The other terminal of the feedback resistor G is connected to a base of the transistor $q_3$ and to a collector of the transistor $q_2$. The emitter of the transistor $q_3$ is connected to the anode of a diode $d_g$, whose cathode is connected to the circuit ground. The emitters of the transistors $q_1$ and $q_2$ are connected to the circuit ground through a tail current source 2K.

Voltage differences are sensed in a termination resistor R connected between the nodes $V_o$ and $V_x$. The voltages at nodes $V_o$ and $V_x$ are input into a non-inverting and an inverting input of an operational amplifier (OA) U1 through resistors $r_1$ and $r_2$, respectively. A bypass capacitor $c_2$ connects the non-inverting input of the OA U1 to the circuit ground. The output of the OA U1 is connected to its inverting input through an integrating capacitor $c_1$ as well as to the input of an inverting voltage to current converter, U0. The output of the current converter U0 is drives the base of the transistor $q_3$.

Figure 7:
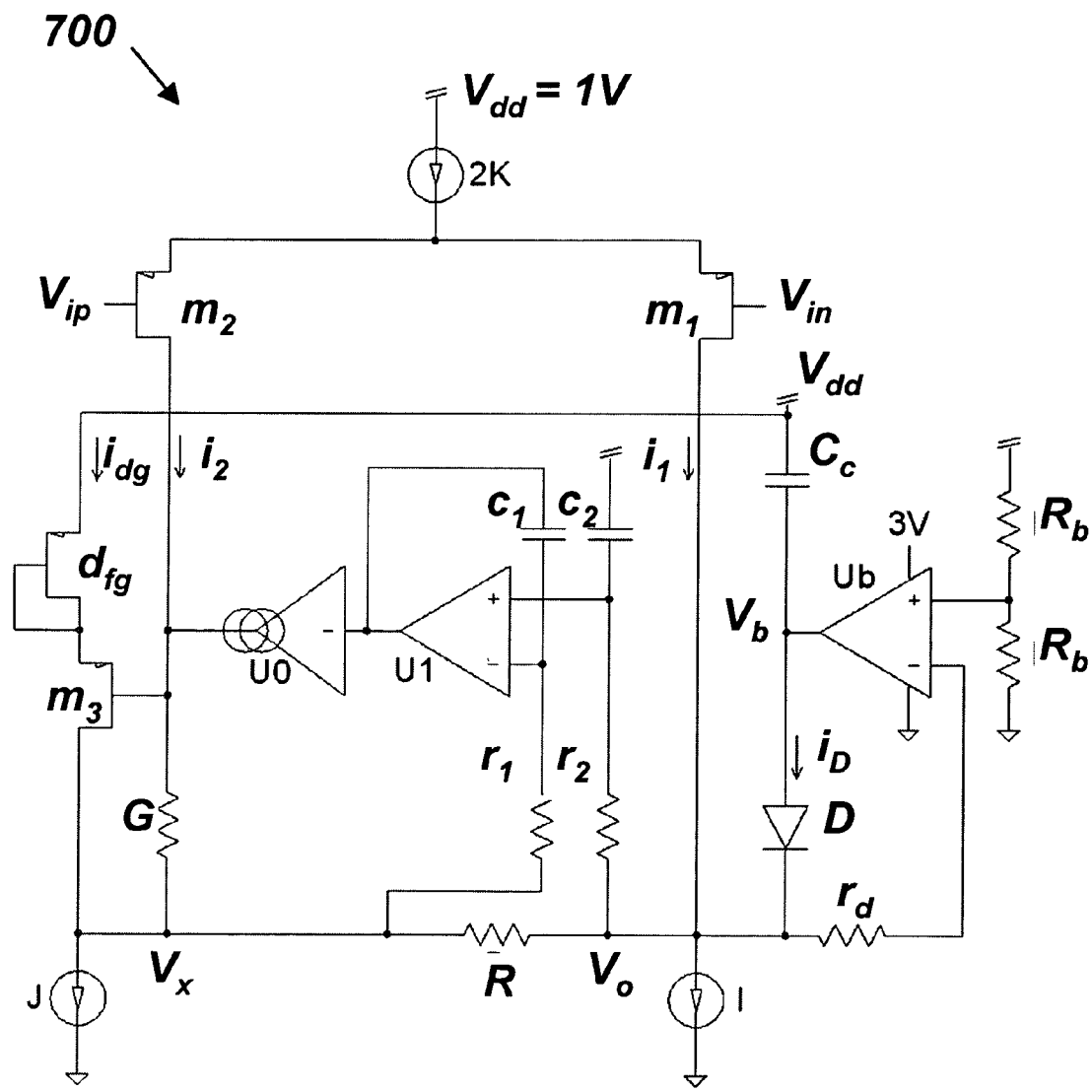
FIG. 7 is the circuit of a MOSFET VCSEL driver with a termination according the a second embodiment of the invention.

The common mode voltage of signals $v_{ip}$ and $v_{in}$ should be less than two diode drops above the circuit ground reference if using the npn bipolar transistors $q_1$ and $q_2$ as shown, or less than $2*V_t$ above a voltage reference if using low voltage NMOS FETs $m_1$ and $m_2$ in place of the npn bipolar transistors $q_1$ and $q_2$ as shown in FIG. 7.

The input signals $v_{ip}$ and $v_{in}$ typically have 10 to 90% rise and fall times less than 0.35/(data rate) for best high speed performance.

An analysis of the DC bias for the differential input amplifier 600 will now be presented in the neutral input condition, i.e. when $v_{ip}=v_{in}$. The differential pair $q_1$ and $q_2$ splits the tail current 2K into two equal currents K such that $$i_1=i_2=K \qquad \text{Equation [2]}$$

A DC-coupled low frequency feedback loop comprises the OA U1, the current converter U0, and the components $r_1$, $r_2$, $c_1$, and $c_2$, which act to ensure that the current through a termination resistor R is maintained at zero. The resistors $r_1$ and $r_2$ are equal in value, which is substantially larger than the value of the termination resistor R:

$$r_1 = r_2 \gg R \qquad \text{Equation [3]}$$

Thus, the output voltage $V_o$ is given by:

$$V_o = (I-K)*z_D \qquad \text{Equation [4]}$$

where $z_D$ is an impedance of the diode D.
Also, $$V_x = V_o \qquad \text{Equation [5]}$$

since no current flows in the termination resistor R. The transistor $q_3$ will be conducting a current (J−K), with current K flowing through the feedback resistor G. The components $r_1, r_2, c_1,$ and $c_2$ along with the gain of the current converter U0 and the OA U1 set the loop bandwidth to a desired frequency, typically around 200 kHz. The current converter U0 could also be implemented with an inverting gain voltage amplifier with an output impedance much greater than the input impedance of the shunt amplifier formed by the transistor $q_3$ and the feedback resistor G. This latter requirement on the output impedance ensures that little of the transistor $q_2$ collector current flows into the current converter U0.

Note that diode $d_g$ and the base-emitter voltage $V_{be}$ of transistor $q_3$ in series generate a voltage drop of approximately 1.5V, which is close to a threshold voltage $V_t$ of the VCSEL diode D. Thus a convenient bias point for modulation of the VCSEL diode D is established in a range suitable for the operation of the driver circuit 600.

Using the DC operating point for the input voltages $v_{ip} = v_{in}$ as a reference, the static circuit currents and voltages for $v_{ip} > v_{in}$ and for $v_{ip} < v_{in}$ can be described as shown in Table 1:

TABLE 1

|  | $i_1$ | $i_2$ | $i_{dg}$ | $i_D$ | $V_x$ | $V_o$ |
|---|---|---|---|---|---|---|
| $v_{ip} = v_{in}$ | K | K | J − K | I − K | define = 0 | define = 0 |
| $v_{ip} > v_{in}$ | 2K | 0 | J − 2K | I | K*G | K*$z_D$ |
| $v_{ip} < v_{in}$ | 0 | 2K | J | I − 2K | −K*G | −K*$z_D$ |

The values given in this table are accurate as long as the DC coupled low frequency feedback loop is allowed sufficient time to settle. At data rates higher than the loop bandwidth of the DC coupled low frequency feedback loop, the values of G, R, I and J need to be chosen relative to the diode impedance $z_D$ to ensure that the average modulated voltages and currents match the DC values for the circuit.

For operation at frequencies greater than the loop bandwidth of the DC coupled low frequency feedback loop, the output voltage $V_o$ can be expressed as the superposition of the voltage $V_x$ multiplied by the voltage divider formed by the diode impedance $z_D$ and the termination resistor R, plus the current flowing into node $V_o$ multiplied by the parallel value of the termination resistor R and the diode impedance $z_D$. So, writing the superposition equations for the two values of $v_{ip}$ and $v_{in}$, relative to the values of $V_x$ and $V_o$ for $v_{ip} = V_{in}$:

$$v_{ip} > v_{in}: V_o = K*G*z_D/(R+z_D) + K*R*z_D/(R+z_D) \qquad \text{Equation [6a]}$$

$$v_{ip} < v_{in}: V_o = -K*G*z_D/(R+z_D) - K*R*z_D/(R+z_D) \qquad \text{Equation [6b]}$$

Next, values for the termination resistor R and the feedback resistor G are chosen such that the DC and the high speed average modulated value of $V_o$ are equal.
Note that:

$$V_o(v_{ip} > v_{in}) = -V_o(v_{ip} < v_{in}) \qquad \text{Equation [7]}$$

so it is possible to write one equation for both conditions, setting the DC value equal to the modulated value:

$$K*z_D = K*G*z_D/(R+z_D) + K*R*z_D/(R+z_D) \qquad \text{Equation [8]}$$

which simplifies to $$R+z_D = G+R, \qquad \text{Equation [9]}$$

which is satisfied when $G=z_D$.

This allows the termination resistor R to be chosen based on other considerations, such as the output impedance of the driver. If diode D is replaced by a sine wave current source operating at a frequency higher than the loop bandwidth of the DC coupled low frequency feedback loop, then it is seen that the driver output impedance value is R, since the output impedance of the shunt feedback amplifier formed by the transistor $q_3$ and the feedback resistor G is ideally zero.

For the best termination of a load impedance $z_D$, $$R = z_D \qquad \text{Equation [10]}$$

So, preferably, the feedback resistor G is chosen such that $$G = R = z_D \qquad \text{Equation [11]}$$

In practice, since the output impedance of the shunt feedback amplifier in series with the diode $d_g$ is approximately $2/g_m$, where $g_m$ is the average transconductance of the transistor $q_3$ and of the diode $d_g$, then somewhat more practical values are:

$$R + 2/g_m = z_D = G \qquad \text{Equation [12]}$$

It has been found in practice that values larger or smaller than these calculated values still allow the driver amplifier to work well, although under modulation the current through the termination resistor R will be non-zero. What this means is that the high frequency, modulated amplitude and DC amplitude of $V_o$ will no longer be given accurately by the above equations. Still, the circuit will swing above and below the DC operating point given by $v_{ip} = v_{in}$ with equal amplitudes so the driver is well behaved. This is important, because impedance $z_D$ varies somewhat from driver unit to driver unit, as do the feedback resistor G and the termination resistor R when fabricated as an integrated circuit.

From Table 1, the maximum VCSEL current, or 'one' level current is I. The minimum or 'zero' level current is I−2K. An advantageous property of this driver is that a supply current, I+J, from the voltage supply $V_{dd}$ is independent of the modulation amplitude of the tail current 2K. Since the currents I and J are constant, the supply current does not change. Ideally, this means no supply bypass capacitors are needed to keep the voltage 'quiet' or noise-free, so that cross-talk to neighboring circuits does not result.

In practice, fast edges and slight delay mismatches in the circuit often lead to current spikes on supply voltage $V_{dd}$ during edge transitions. These spikes are approximately (I+J)/10 in amplitude, with duration equal to the rise and fall time of input voltages $v_{ip}$ and $v_{in}$. Since for high speed operation, the rise and fall times are very fast, perhaps 10 ps to 50 ps, good supply bypassing is best achieved with small values of capacitance having a very high self resonant frequency. Small values of capacitance are convenient for on-chip bypassing.

Choosing J=I is advantageous. If J is less than I, the collector current in the transistor $q_3$ may be insufficient to keep it biased with sufficient current for high speed operation. If J is greater than I, excess supply power will be dissipated.

There is an even more advantageous reason for choosing J=I. Referring to Table 1, note that if I=J, then $i_{dg}$ and $i_D$ are always equal, but opposite in phase. This means that for the driver 600 in FIG. 6, at the circuit ground node where $i_{dg}$ and $i_D$ sum together, the current is constant at $(2I-2K)$ regardless of input voltage conditions $v_{ip} > v_{in}$ or $v_{ip} < v_{in}$. Ideally then, there are no transient currents which can create ground bounce, which, if present, could cause problems within the driver and in nearby circuits.

As in the case of the supply current, the ground current at the circuit ground node also has spikes related to the input signal rise and fall time as well as to the signal delay through diode D. The phase and amplitude of spikes in the ground current and the supply current are such that placing a small capacitor between $V_{dd}$ and the circuit ground node allows these currents to cancel each other, thus further improving the 'quietness' of the driver circuit 600.

When the diode D is a VCSEL, it is usually connected with parallel wire-bonds to the driver chip. Because of the way the currents $i_{dg}$ and $i_D$ are designed to be of equal amplitude and opposite phase, the circuit ground connection of VCSEL D will tend to extract a current from the cathode equal to the current supplied to the anode of VCSEL D, thereby ensuring a quasi-differential drive. Thus benefits can be gained in terms of speed, jitter reduction, and the confinement of electromagnetic fields emanating from the wire-bonds. This feature permits very fast operation of the driver circuit, making it suitable for operation at high data rates.

A further advantage of the driver circuit 600 is its robustness with respect to consecutive identical digit (CID) streams as long as several hundred bits. The 'one' and 'zero' levels tend not to shift very much. The exact value of CID allowed depends upon the loop bandwidth of the DC coupled low frequency feedback loop.

FIG. 7 shows the implementation of a second embodiment of the invention in deep submicron CMOS (gate length<180 nm, such as 90 nm or even shorter), where the power supply voltage $V_{dd}$ may be limited typically between 1.0 V and 1.2 V. The driver 700 is similar to the driver 600 described above, however the differential input npn bipolar transistor pair $q_1$ and $q_2$ has been replaced with a differential input PMOS FET pair $m_1$ and $m_2$ having differential voltage inputs $v_{in}$ and $v_{ip}$ applied to their respective gate terminals, respectively. The sources of the PMOS FETs $m_1$ and $m_2$ are connected together and biased by a current source 2K from the supply voltage $V_{dd}$. An operational amplifier (OA) Ub operating from a separate supply voltage of 3 volt is added for driving the VCSEL D. The function of the termination resistor R, the diode $d_{fg}$ and the PMOS FET $m_3$ is similar to that of the termination resistor R, the diode $d_g$ and the transistor $q_3$, respectively, in the driver 600.

Since the VCSEL D requires a still higher voltage to bias it properly, OA Ub is used to supply the approximately 2.6V bias required at the anode of the VCSEL D. The non-inverting input of the OA Ub is connected to a series combination of two bias resistors $R_b$ between the supply voltage $V_{dd}$ and the circuit ground to keep the cathode of VCSEL D centered at a voltage of approximately $V_{dd}/2$ for optimum bias of the driver 700. Capacitor $C_c$ couples the high frequency components of VCSEL current $i_D$ back to $V_{dd}$ so that the currents $i_{dg}$ and $i_D$ may still sum and cancel as described previously.

Figure 8:
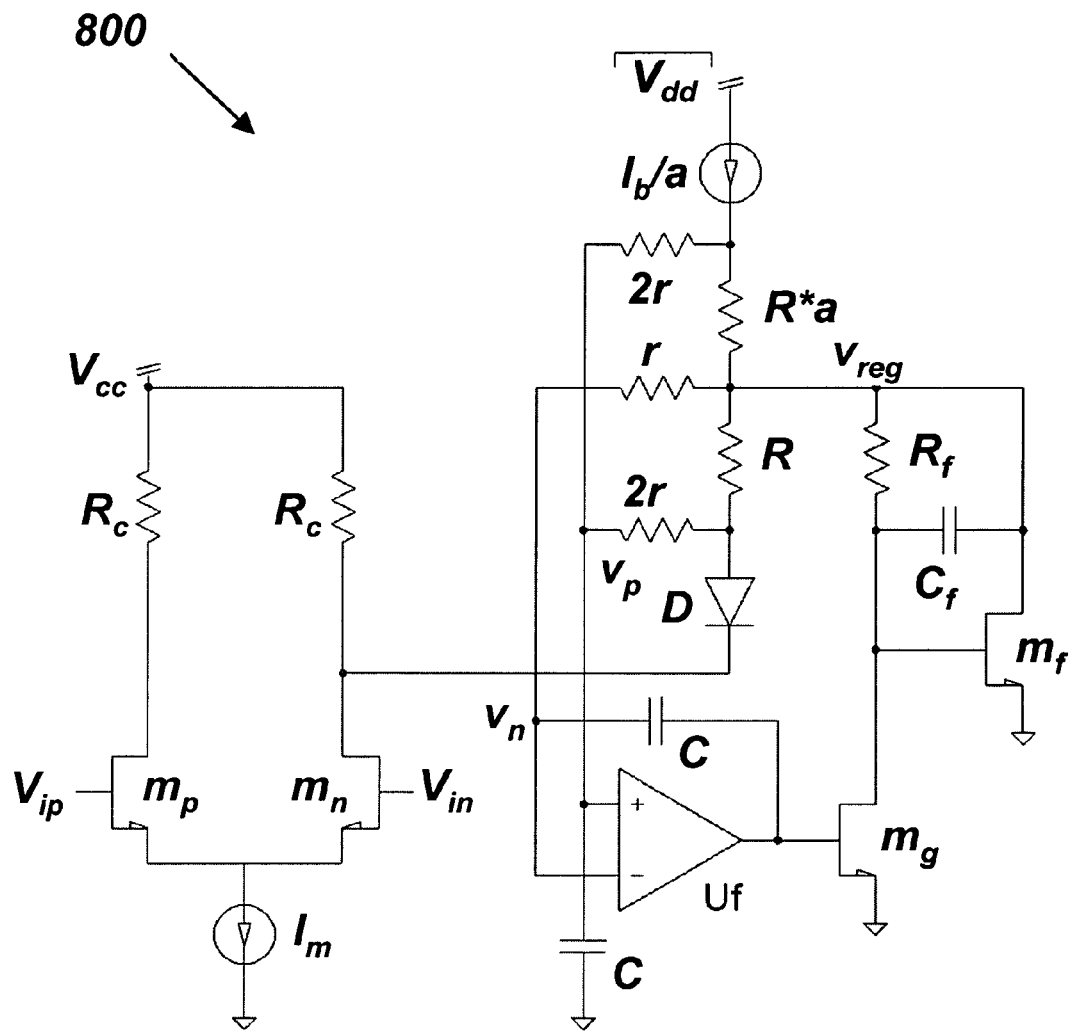
FIG. 8 is the circuit of a MOSFET VCSEL driver with a termination according the a third embodiment of the invention.

A third embodiment of the invention is shown in FIG. 8, comprising a low power DC coupled driver 800 for driving a diode D (such as a VCSEL). It is both accurate and low power, made suitable for very high speed data rates through the incorporation of an active back termination.

In particular, driver 800 exhibits stability against baseline wander during long CIDs or where the DC content of the differential input data is not balanced.

Differential voltage inputs $v_{ip}$ and $v_{in}$ are each connected to a gate on a differential input NMOS transistor pair $m_p$ and $m_n$, respectively, each of whose drain is connected to a first supply voltage $V_{cc}$ through corresponding load resistors $R_{cp}$ and $R_{cn}$. Load resistors $R_{cp}$ may not be necessary as in high speed circuits it tends to make the input impedance at the gate of transistor $m_p$ equal to that at transistor $m_n$ by providing a matched termination of capacitor $C_{dg}$ of each transistor, but it is not required that this resistor be present or that it be the same value as $R_{cn}$. Sources of the transistors $m_p$ and $m_n$ are connected together to a current source $I_m$ working into the ground connection. A cathode of the diode D is connected to the drain of transistor $m_n$, while its anode is fed from a voltage $v_{reg}$ through a resistor R. The voltage $v_{reg}$ in turn is generated from a second supply voltage $V_{dd}$ through a current source $I_b/a$ in series with a load resistor $R^*a$, where 'a' is a constant less than 1, typically being equal to ½. A low speed feedback circuit comprising an upper current source $I_b/a$, transistors $m_g$ and $m_f$, a feedback capacitor $C_f$, a feedback resistor $R_f$ and an OA $U_f$ also drives the voltage $v_{reg}$. Voltages at the upper current source $I_b/a$ and at the anode of the diode D are sensed through two resistors $2r$, respectively, which are connected to a voltage node $v_p$ at the non-inverting input of the OA $U_f$ which is AC grounded through a bypass capacitor C to circuit ground. Voltage $v_{reg}$ is sensed by resistor r connected to a voltage node $v_n$ at the inverting input of the OA $U_f$. An integrating capacitor C is connected from an output of the OA $U_f$ to the inverting input voltage node $v_n$.

Resistors r and $2r$ are much larger than resistors R and $R^*a$. Also, the value of R is kept small relative to the impedance $z_D$ of VCSEL diode D.

First, consider the operation of the circuit at low frequencies, where the entire feedback path is operational. A low speed feedback circuit consisting of the differential input operational amplifier $U_f$, the transistors $m_g$ and $m_f$, the resistors $R_f$, r, and $2r$, and both capacitors C, keeps voltages $v_p$ and $v_n$ equal to each other. This forces the DC and low frequency current in the resistor R to equal a current $I_b$, and the current in the resistor $R^*a$ to equal $I_b/a$. Hence, neglecting the small current through $R_f$ (for $R_f$ fairly large), the drain current of transistor $m_f$ equals $I_b(1/a-1)$.

So, the low speed feedback circuit continues to supply a constant current $I_b$ to the diode D by adjusting the voltage $v_{reg}$ to ensure that despite the modulation current impact on the current value in diode D, $v_{reg}$ stays at a constant average value, which prevents baseline wander. The low speed feedback circuit acts like a current controlled voltage source, adjusting the value of $v_{reg}$ to ensure that current $I_b$ flows in diode D.

Now consider the operation of the circuit at high frequencies. Within the low speed feedback circuit just described is a high speed shunt feedback amplifier, consisting of the transistor $m_f$, the feedback capacitor $C_f$ and the feedback resistor $R_f$ which acts to keep the voltage $v_{reg}$ constant. The goal of the high speed shunt feedback amplifier is compatible with the low speed feedback circuit, which performs the same function, but at low frequencies by ensuring a proper current split between $R^*a$ and R. As a modulation current $I_m$ is switched into the load resistor $R_{cn}$ and the impedance $z_D$, with $I_D$ given by Equation 13 flowing through the diode D, this current also flows through resistor R, which causes $v_{reg}$ to change.

$$I_D = I_m * R_{cn}/(R_{cn} + z_D + R)$$ Equation [13]

Since the bandwidth of $m_f$, $C_f$, and $R_f$ is very high, this circuit immediately responds to cancel the change in current at node $v_{reg}$, thus quickly restoring $v_{reg}$ to the desired value. Due to an output impedance, $z_o$, of the high speed shunt feedback amplifier being approximately $1/g_m$ of transistor $m_f$, there is some swing at the node $v_{reg}$ as the modulation current $I_m$ from the differential transistor pair $m_p$ and $m_n$ driver is switched into and out of the VCSEL diode D. The output impedance $z_o$ is essentially added to the value of the diode impedance $z_D$, so that the portion of the current $I_m$ into VCSEL diode D is split according to the equation $I_m*R_{cn}/(R_{cn}+z_D+R+1/g_m)$. Thus the value of the current $I_D$ into diode D is reduced by the output impedance $z_o$ of the high speed shunt feedback amplifier, but the ability to prevent baseline wander above the low frequency corner is not impacted.

Figure 4:
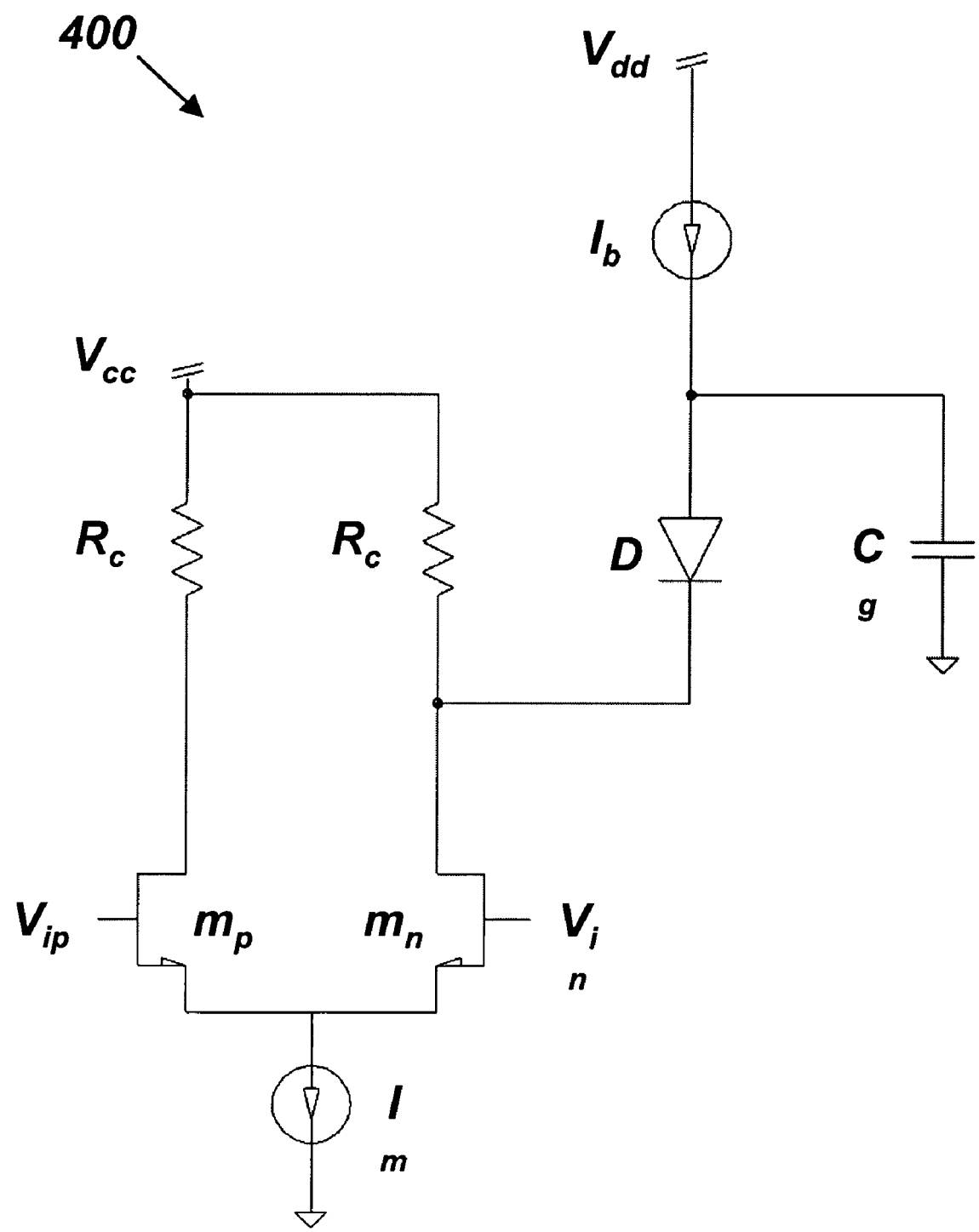
FIG. 4 is the circuit of a prior art NMOS FET VCSEL driver with a separate supply voltage for the VCSEL and a bypass capacitor.

The low speed feedback circuit in concert with the high speed shunt feedback amplifier acts like a very large value of the capacitor $C_g$ in the prior art driver 400 shown in FIG. 4. With $r=5$ megohm, $2r=10$ megohm, $C=2$ pF, $C_f=5$ pF, $R_f=2$ kohm, $g_m(U_f)=100$ μmho, $g_m(m_g)=2.5$ mmho, $g_m(m_f)\, g_m=24$ mmho, and $R=5$ ohm, the low speed feedback circuit has a low frequency corner of about 10 kHz with a 50 degree phase margin. To achieve the 10 kHz corner frequency with the capacitor $C_g$ in the prior art driver 400 would require $$C_g=(1/2\pi*10\text{ kHz})/(z_D+R_c)=0.11 \text{ μF}, \quad \text{Equation [14]}$$

which is too large a capacitance to be practical on an integrated circuit and for which there is insufficient off-chip room in many applications.

Clearly, it is an advantage of this embodiment that the low frequency corner can be set to any desired frequency using component values compatible with on-chip integrated circuit processes in use. The penalty for this improvement in performance relative to the prior art driver 400 is an increase in power dissipation. The complete power dissipation for the low power VCSEL driver 800 given by Equation 15 constitutes an increase of $V_{dd}*I_b*(1/a-1)$.

$$P_{diss}=V_{cc}*I_m+V_{dd}*I_b/a \quad \text{Equation [15]}$$

Figure 9:
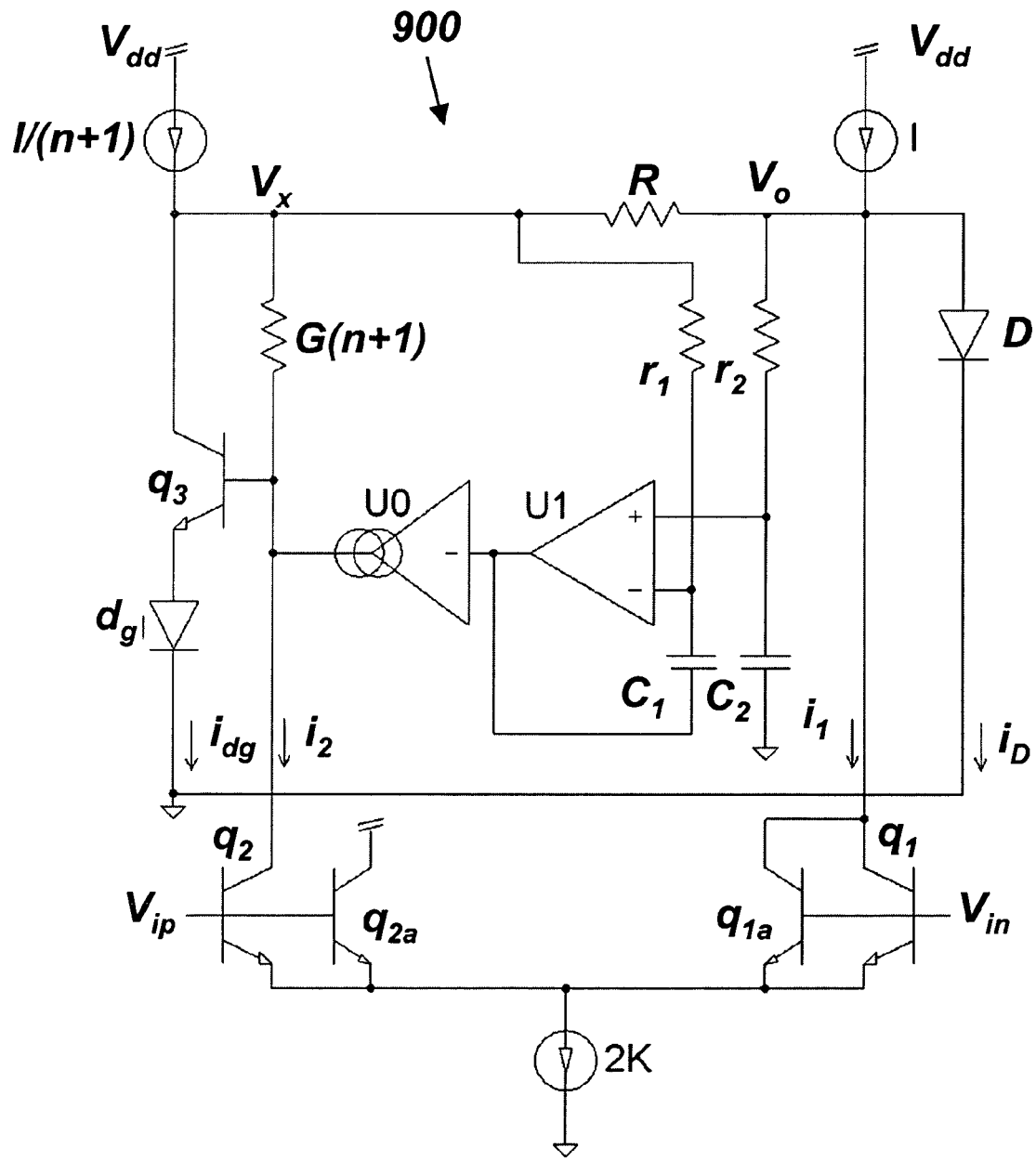
FIG. 9 is the circuit of a bipolar VCSEL driver with a termination according the a fourth embodiment of the invention.

A fourth embodiment of the invention is presented in FIG. 9. A DC coupled driver 900 for driving a VCSEL with accuracy and low power, is made suitable for very high speed data rates by incorporating an active back termination.

The invention operates on the same principles as described in the first embodiment shown in FIG. 6. In the driver 900 two bipolar transistors $q_{1a}$, $q_{2a}$ have been added to the transistor pair $q_1$, $q_2$, respectively, while scaling the value of several components to achieve a large reduction in power dissipation, but retaining most of the advantages of driver 600. The emitters of the four transistors $q_{1a}$, $q_{2a}$, $q_1$, $q_2$ are all connected together. However, the collector of transistor $q_{2a}$ is connected to the supply voltage $V_{dd}$ whereas the collectors of transistors $q_1$ and $q_{1a}$ are connected together at node $V_o$ to a current source I that is fed from the supply voltage $V_{dd}$.

The emitter area of the transistors $q_{2a}$ is scaled to be 'n' times larger than for transistor $q_2$, so that 'n' times the amount of current will flow in that transistor. The factor 'n' is generally chosen as large as possible within the matching limitations of the devices available, a typical value would be at least 10. Thus, current $i_2$ is a fraction $1/(n+1)$ of the current source I. To maintain the voltage $V_x$ at the same level as in the driver 600, the feedback resistor G is increased in value by the factor $(n+1)$ to $G(n+1)$. For similar reasons, the current source J in the driver 600 is replaced by a current source approximately equal to $I/(n+1)$. With these changes, the driver 900 of FIG. 9 operates similar to the driver 600 of FIG. 6.

One disadvantage of the driver 900 compared to the driver 600 is that the supply current is not constant. As the modulation current 2K is switched back and forth between the differential pair transistors $q_{1a}$, $q_1$, and $q_{2a}$, $q_2$, the supply current will also be modulated. This will require more careful supply voltage bypassing than for the driver 600.

An advantage of the driver 900 over the prior art is that the current drawn from $V_{dd}$ is reduced from (I+J) or 2I where I=J in the typical case, to only $I(n+2)/(n+1)+K$ for a 50% duty cycle in the input data. In typical VCSEL driving applications, the current K tends to be approximately I/4, so for n=10, the invention requires only ⅔ as much supply current. This makes the supply current nearly the same as the very simple prior art current steering driver 100 with no back termination as shown in FIG. 1, which has power supply current I+K.

Figure 1:
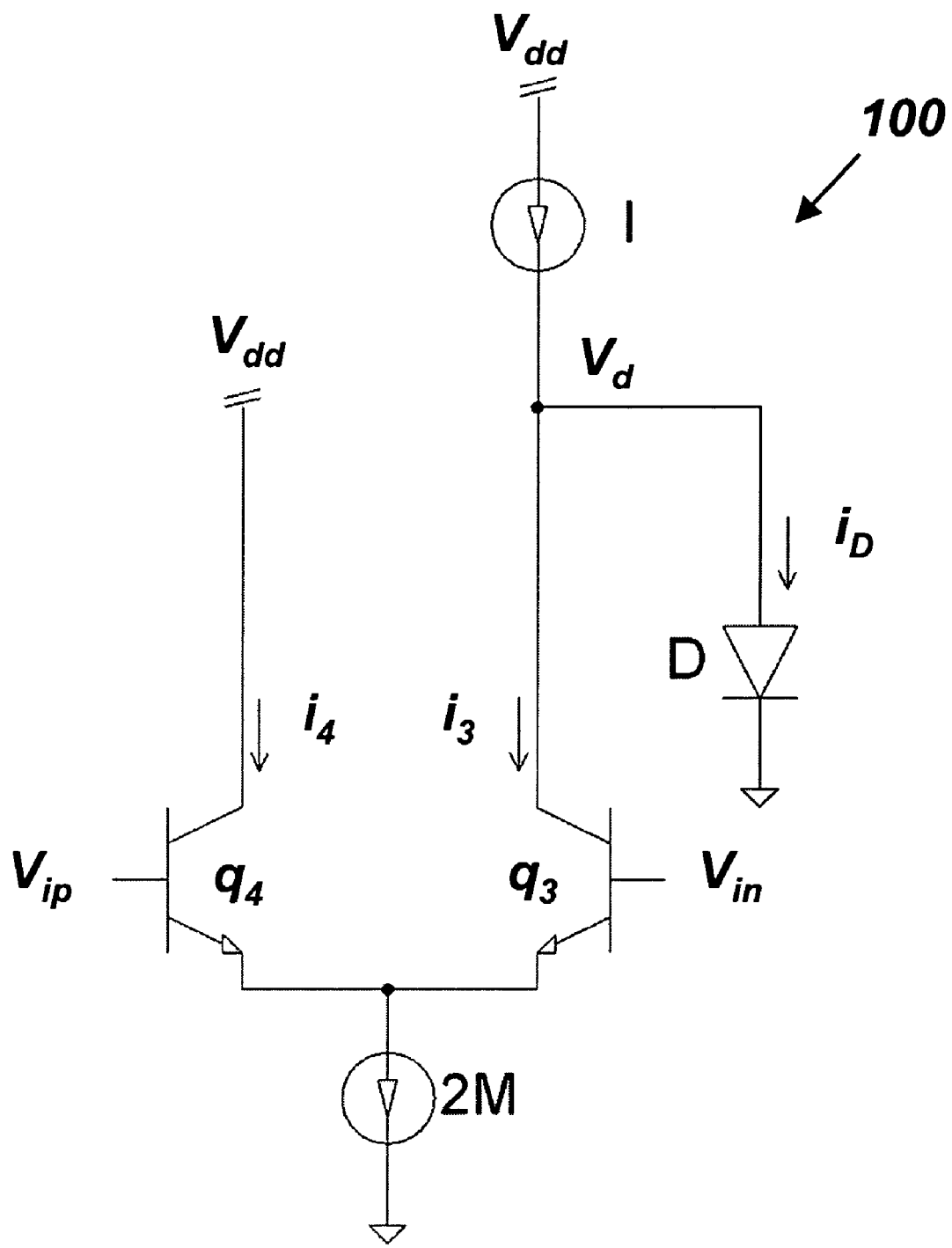
FIG. 1 is the circuit of a simple prior art bipolar VCSEL driver.
Figure 2:
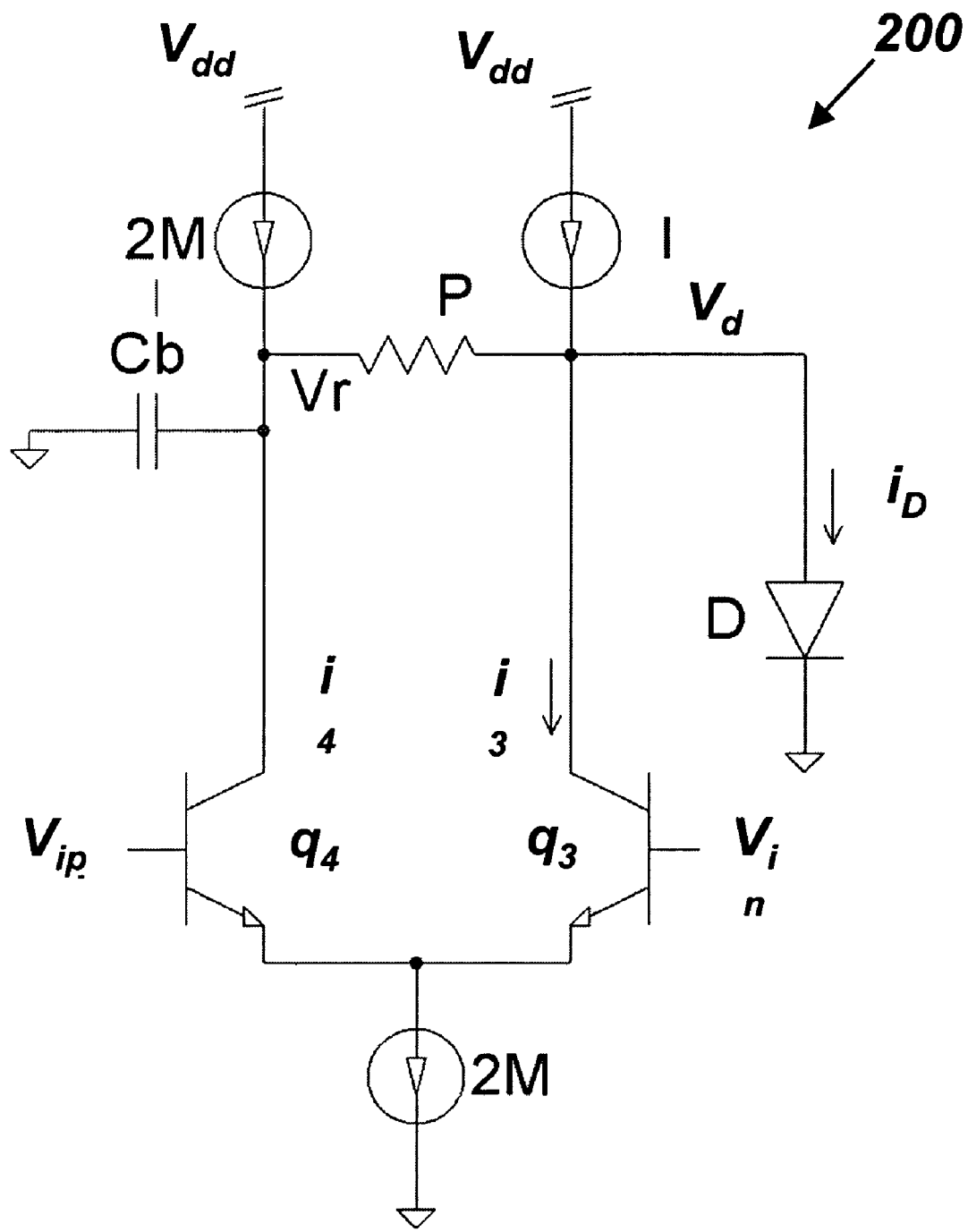
FIG. 2 is the circuit of a prior art bipolar VCSEL driver with a termination.
Figure 3:
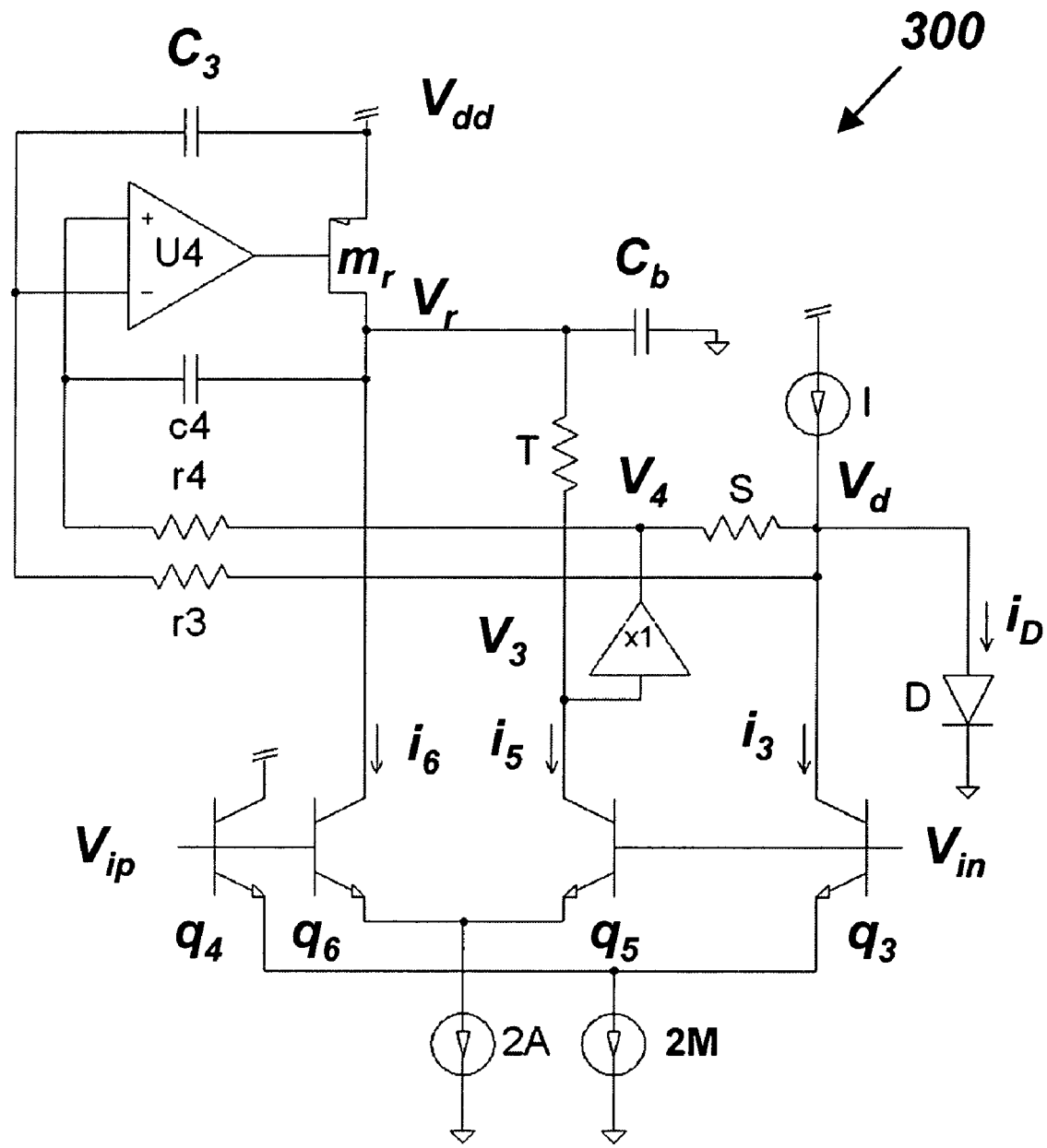
FIG. 3 is the circuit of a prior art VCSEL driver with a termination and additional feedback loop.

Advantageously the driver 900 also provides a controlled output impedance or back termination, that is absent in the prior art driver 100 in FIG. 1. This makes the driver 900 more suitable for operation at high data rates. Compared to the prior art driver 100, where a modulation current also appears on the supply voltage, there is no difference in bypassing requirements for the driver 900.

A fifth embodiment comprises essentially the same circuit as for driver 900, but with all the npn bipolar transistors replaced with NMOS FETs, so that the emitter, base and collector connections are substituted by source, gate and drain connections, respectively. Where the supply voltage $V_{dd}$ is limited to low values such as 1.2 V or less by CMOS processes with short gate length e.g. 90 nm or shorter, the ground connection of the cathode of the diode D would need to be replaced with a connection to a negative voltage source.

In a sixth embodiment, the polarity of all the FETs is changed so that the NMOS FETS of the fifth embodiment are exchanged for PMOS FETs. This requires the circuit ground and the supply voltage connections to be swapped.

Figure 10:
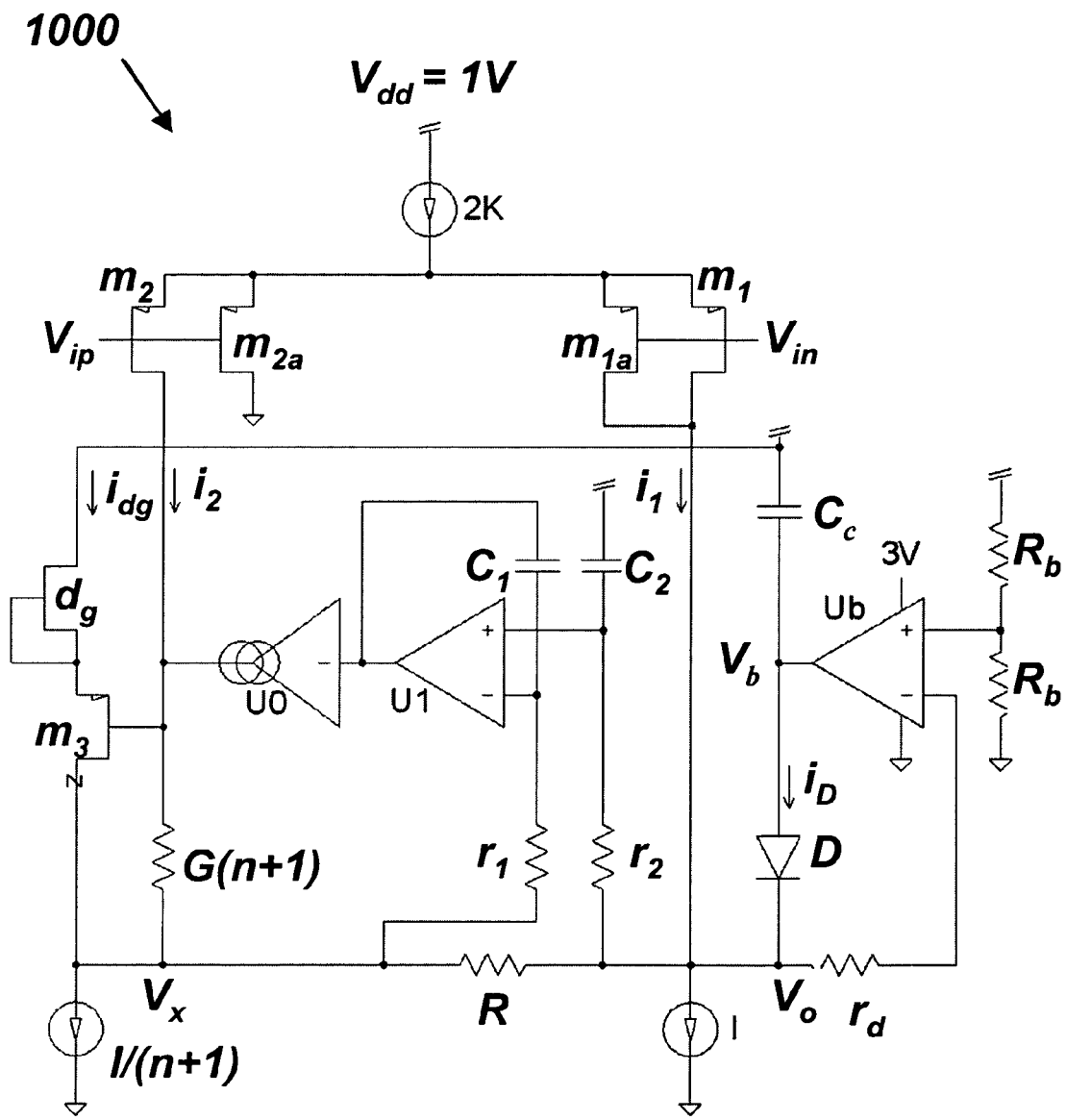
FIG. 10 is the circuit of a MOSFET VCSEL driver with a termination according the a fifth embodiment of the invention.

FIG. 10 shows a seventh embodiment of a VCSEL driver 1000 implemented in deep sub-micron CMOS technology (gate length less than 180 nm, such as 90 nm), in which the power supply may be limited to typically 1.0V to 1.2 V. Along the lines of the previous embodiment 900, the driver 700 shown in FIG. 7 is modified by an expansion of the FET differential pair with two additional PMOS FETs $m_{1a}$ and $m_{2a}$ paralleled with the FETs $m_1$ and $m_2$ and driven by the same input gate voltages, respectively. The gate width of the PMOS FET $m_{2a}$ is scaled by a factor 'n', analogous to scaling the emitter area of the bipolar transistor $q_{2a}$ in the driver 900. The factor 'n' is generally chosen as large as possible within the matching limitations of the devices available, a typical value would be at least 10.

Since the VCSEL D still requires a higher voltage to bias it properly, amplifier Ub is used to supply the approximately 2.6V bias required at the anode of the VCSEL D. The midpoint of two equal series resistors $R_b$ connected between supply voltage $V_{dd}$ and circuit ground provides a voltage reference for OA Ub to keep the cathode of VCSEL D centered at approximately $V_{dd}/2$ for optimum bias of the driver 1000. Coupling capacitor $C_c$ couples the high frequency components of diode current $i_D$ back to supply voltage $V_{dd}$ so that the currents $i_{dg}$ and $i_D$ may still sum and cancel as described previously.

Figure 11:
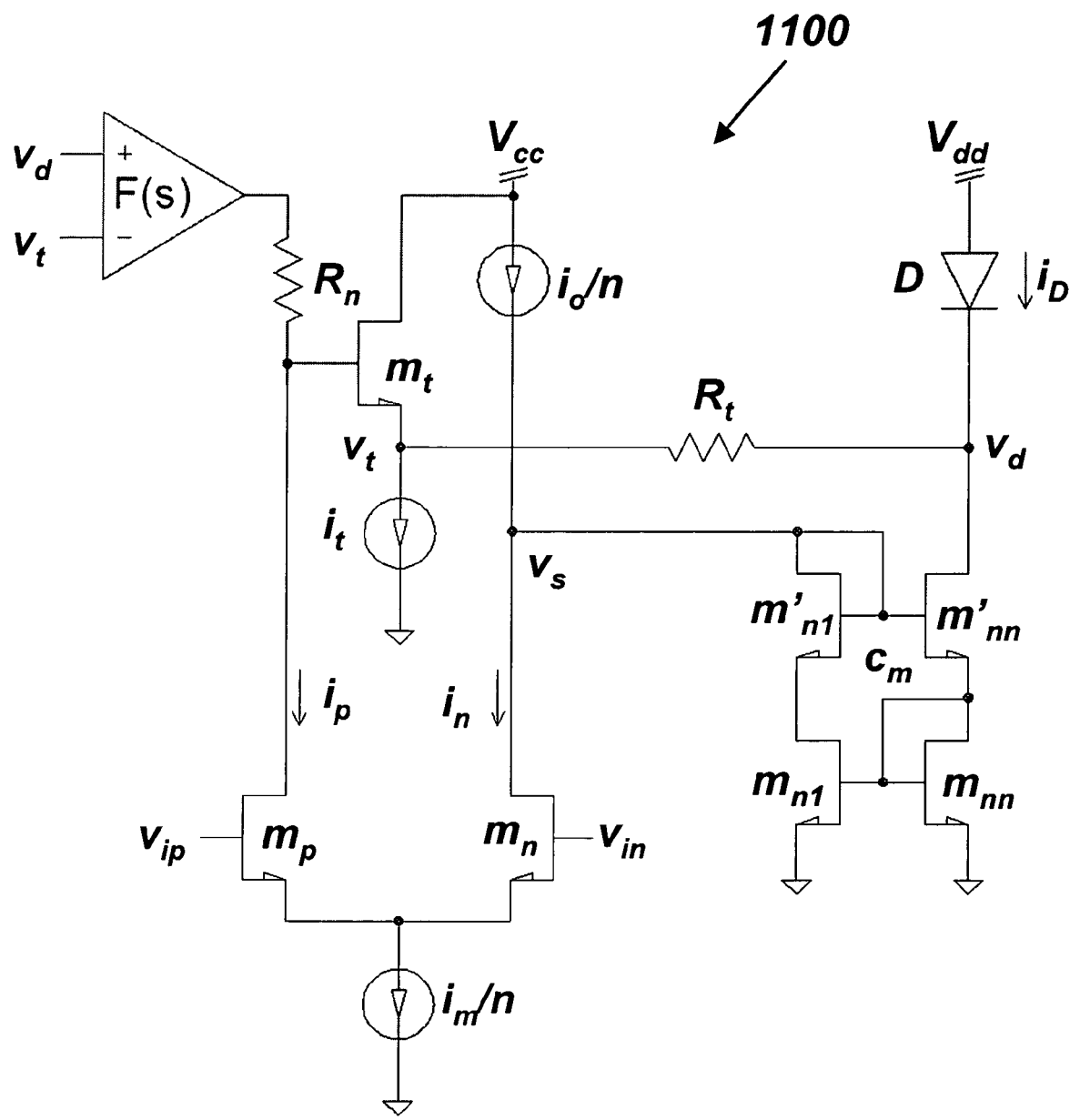
FIG. 11 is the circuit of a MOSFET VCSEL driver with a termination according the a sixth embodiment of the invention.

An eighth embodiment of a DC coupled driver according to the invention is shown in FIG. 11. The DC coupled driver 1100 for provides an accurate and low power drive for a common anode VCSEL D is suitable for very high speed data rates due to the incorporated active back termination.

Referring to FIG. 11, a differential input voltage $v_{ip}-v_{in}$ acting on a differential field effect transistor pair $m_p$ and $m_n$ switch a current $i_m/n$ between the transistors $m_p$ and $m_n$. When $v_{in}>v_{ip}$, the current $i_n=i_m/n$, and current $(i_o-i_m)/n$ flows into a current mirror labeled $c_m$ comprising the FETs $m_{n1}$, $m_{nn}$ and $m'_{n1}$, $m'_{nn}$. The current mirror $c_m$ provides a current gain of 'n', being greater than or equal to 1. In integrated circuits, this is usually achieved by making the gate width of the FET $m_{nn}$ 'n' times that of the FET $m_{n1}$, for instance. In the case of bipolar transistors, emitter areas of the corresponding transistors are scaled. Thus the current flowing out of $c_m$ into VCSEL diode D is $(i_o-i_m)$. This current corresponds to a minimum drive current, commonly called a zero- or '0' level current.

When $v_{in} < v_{ip}$, the current flowing into the current mirror $c_m$ is $i_o/n$ and the output of the current mirror $c_m$ is $i_o$. This current corresponds to a maximum drive current, referred to as a one- or '1' level drive current for the VCSEL diode D. The additional circuitry described in FIG. 11 is used to control the output impedance of the driver 1100. The value of resistor $R_n$ is chosen to be approximately 'n' times the dynamic impedance of the VCSEL diode D. This means that a peak to peak voltage swing at the gate of a transistor $m_t$ will be close to that of a peak to peak voltage swing at node $v_d$.

An amplifier F(s) consists of a high input impedance, low output impedance amplifier with a dominant response of a single pole low-pass filter or integrator. Negative feedback will cause the DC average value of the voltage difference $v_d - v_t$ to be zero. If the long-term average pulse density of the differential input voltage $v_{ip} - v_{in}$ is balanced between the '1' level and the '0' level, the feedback will ensure that no DC average current will flow in resistor $R_t$, thus keeping the voltage swing at node $v_t$ centered around the swing at node $v_d$. An advantage of including resistor $R_t$ is that it lowers the output impedance of the driver 1100.

Without the resistor $R_t$, the driver output impedance would be that of the current mirror $c_m$, which is very high. A high impedance that does not match the impedance of the VCSEL diode D will allow reflections to persist from previous data bits, which can interfere with the data bit currently transmitted, thereby increasing bit error rates and degrading data eye quality. By using the resistor $R_t$ with the feedback circuitry that forces the DC current through the resistor $R_t$ to zero while allowing the high speed voltage $v_t$ to track the voltage $v_d$, the drive current from $c_m$ flows only into the VCSEL diode D. Thus no drive current is wasted in resistor $R_t$, and the overall power dissipation is minimized.

Another advantage of this embodiment is that a delay through transistor $m_t$ is very nearly equal to a delay of the drive current through the current mirror $c_m$. Thus, the voltage $v_t$ does not lag or lead the voltage $v_d$ significantly, thereby ensuring that the transient current through $R_t$ is minimized, acting in unison with the feedback circuitry that minimizes the DC current flowing through $R_t$.

Ideally, the only current flowing through $R_t$ is the current of a reflection it absorbs, thus preventing the re-reflection of that reflection back toward the VCSEL diode D, where it would interfere with any currently transmitted data bit. The power dissipation of the driver circuit 1100 is higher than the prior art driver 500 in FIG. 5 by approximately the factor 1+1/n.

This small increase in power dissipation is advantageous in that the circuit can be made considerably faster, because smaller currents and smaller transistors can be used to generate the driver signal prior to the current mirror $c_m$. By reducing the size of these transistors, an output voltage of a pre-driver circuitry used to generate signals $v_{ip}$ and $v_{in}$ can be scaled by the same factor of 'n' as well. This represents a considerable reduction in power dissipation, as roughly half the power dissipated in a typical VCSEL driver is consumed by the pre-driver circuitry.

Overall, the driver 1100 in FIG. 11 results in a reduction of total power consumption by roughly a factor of 0.5(1+2/n). For practical implementations of the driver 1100 and pre-driver circuitry, a value of n=3 results in a 20% reduction of power dissipation and a 30% reduction in driver rise and fall times.

For higher values of 'n', power dissipation savings would be larger, but the rise and fall time improvements decline due to gain-bandwidth limitations of current mirrors achievable in state of the art CMOS processes available for the high data rates required in state of the art drivers.

Figure 12:
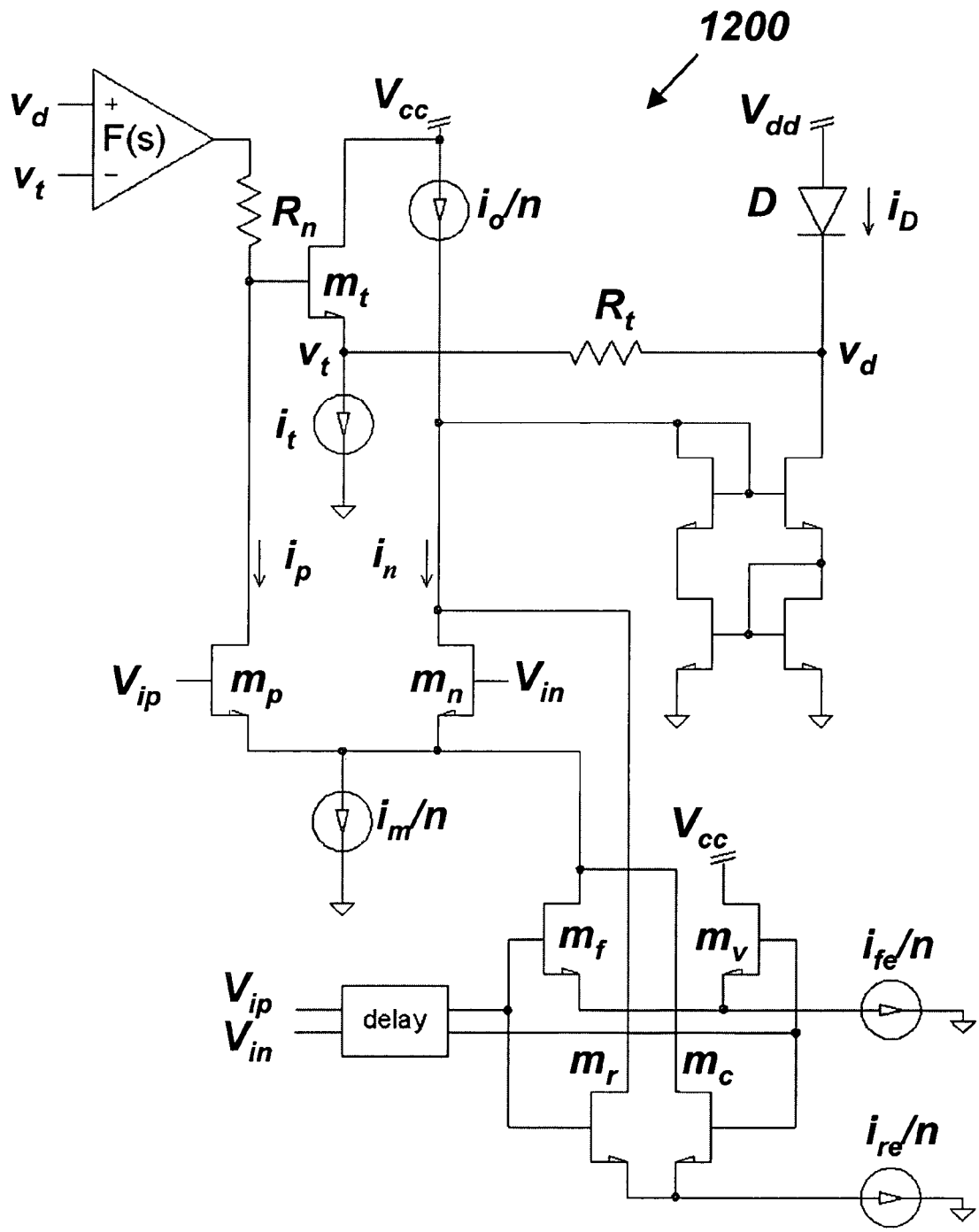
FIG. 12 is the circuit of a MOSFET VCSEL driver with a termination according the a seventh embodiment of the invention.

By incorporating some additional circuitry in the driver 1100 as shown in FIG. 12, a ninth embodiment of the DC coupled driver 1200 is obtained, which allows wave-shaping of the drive current.

The optical/electrical transfer function of a VCSEL D is very non-linear. One of the more important non-linearities is that the VCSEL D takes longer to turn off than to turn on. One way to balance the turn-on and turn-off times is to extract charge from the VCSEL D faster during turn-off than during turn-on. This can be accomplished by causing a falling edge of a VCSEL drive current waveform to overshoot for a duration of 20-50% of a minimum unit interval (UI) pulse width so as to reduce the turn-off time of the VCSEL D. To improve turn-on characteristics of the VCSEL optical eye diagram, it is sometimes also useful to add overshoot to a rising edge of the VCSEL drive current waveform.

A circuit which can perform these two functions starts with a delayed version of the differential input voltage $v_{ip}$ and $v_{in}$. A cell marked delay adds 0.2-0.5 UI of delay to input signals $v_{ip}$ and $v_{in}$ and outputs them to drive a set of differential pairs comprising FETs $m_f$, $m_v$, and $m_r$, $m_c$. The differential pair $m_f$ and $m_v$, with current source $i_{fe}/n$ provides falling edge overshoot. Similarly, the differential pair $m_r$ and $m_c$, with current source $i_{re}/n$ provides rising edge overshoot. The outputs of these are summed with the source and drain currents of the differential FET pair $m_p$ and $m_n$ to provide the desired wave-shaping, which are then amplified by the current mirror $c_m$. The wave-shaping requires additional supply current for operation, thus resulting in a slight increase of power dissipation. To determine the amount of power dissipation required for this circuitry, the same approach may be applied for comparing the power dissipation with the driver 1100.

Figure 5:
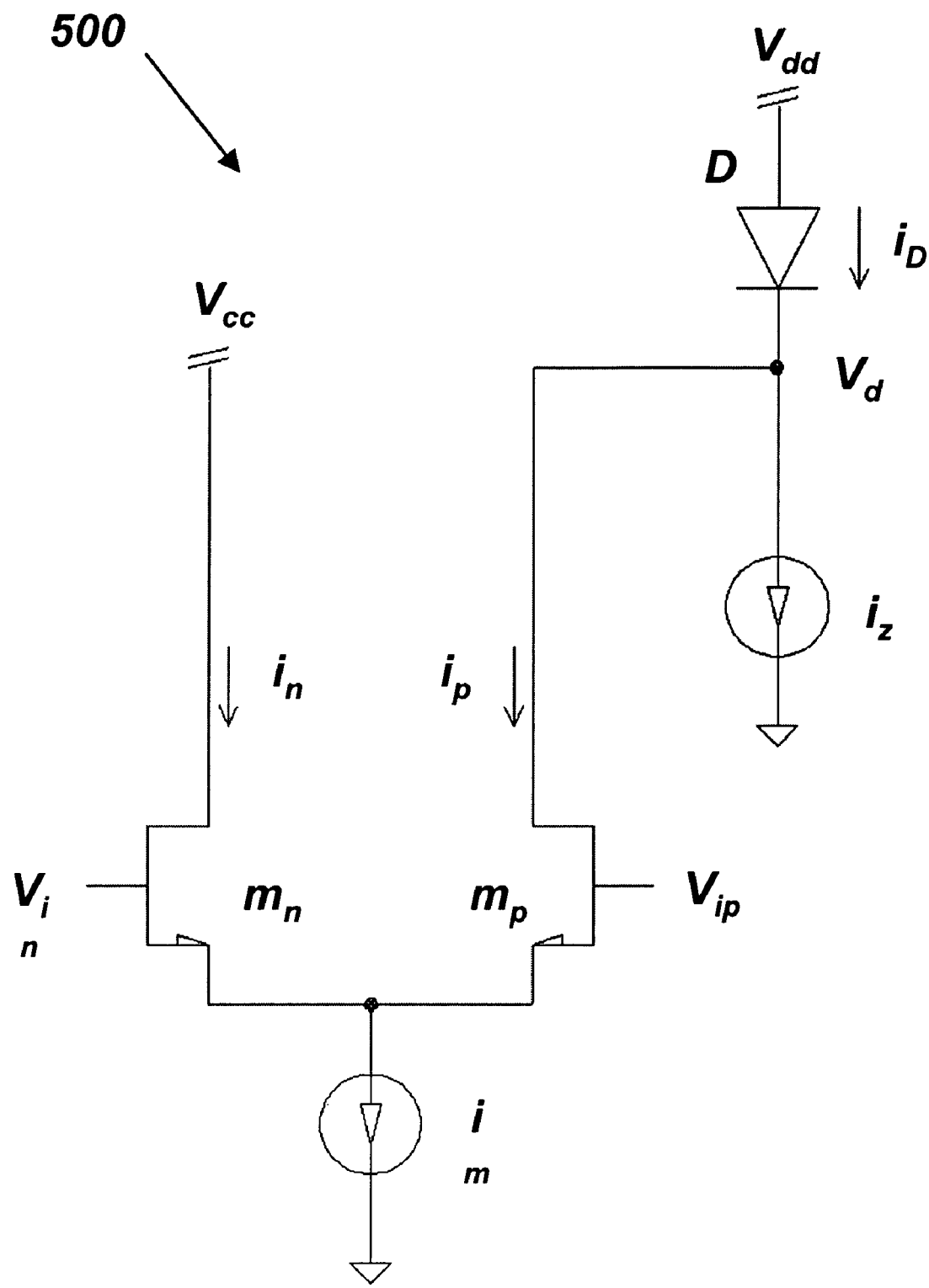
FIG. 5 is the circuit of a prior art NMOS FET VCSEL driver with a separate supply voltage and current source for the VCSEL.

The DC coupled driver 1200 represents a major improvement over the prior art common anode VCSEL driver 500 shown in FIG. 5.

A tenth embodiment comprises essentially the same circuit as for driver 1200, but with all the NMOS FETs replaced with npn bipolar transistors, so that emitter, base and collector connections are substituted for the source, gate and drain connections, respectively.

I claim:

1. A DC-coupled driver for driving a vertical cavity surface emitting laser (VCSEL) diode comprising:
   a first positive voltage supply for providing a supply voltage to the driver during operation;
   a ground rail for providing a current return path to the first positive voltage supply;
   a differential input stage for receiving data and complementary data signals from a signal source, the differential input stage comprising a first and a second transistor, a first and a second output terminal, each connected to the first and a second transistor, respectively, and a modulation current source for biasing the first and second transistors;
   a termination resistor having a first and a second terminal;
   a first current source connected to the first terminal on the termination resistor for providing a current bias to at least one of the VCSEL diode and the first transistor of the differential input stage;

a low frequency differential input feedback amplifier for sensing a voltage drop across the termination resistor, and operational to maintain a predetermined voltage drop across the termination resistor;

wherein the VCSEL diode is connected directly to the termination resistor for actively controlling a driving voltage on the VCSEL diode;

a shunt feedback transimpedance amplifier comprising a bias diode for providing a bias voltage offset, a third transistor for providing gain, and a feedback resistor;

a second current source connected to the second terminal on the termination resistor for providing a current bias to the second transistor of the differential input stage; and an inverting voltage to current converter having an output terminal that is coupled to an input of the shunt feedback transimpedance amplifier;

wherein the low frequency feedback amplifier further comprises:

a first operational amplifier having an inverting input terminal, a non-inverting input terminal, and an output that is connected to an input of the inverting voltage to current converter;

a bypass capacitor connecting the non-inverting input terminal to the ground rail;

a first input resistor connecting the non-inverting input terminal to the first terminal on the termination resistor;

a second input resistor connecting the inverting input terminal to the second terminal on the termination resistor;

an integrating capacitor connecting the inverting input terminal to the output terminal of the first operational amplifier; and wherein the first output of the differential input stage is connected to the first terminal on the termination resistor; and the second output of the differential input stage is connected to the input of the shunt feedback transimpedance amplifier.

2. The DC-coupled driver of claim 1, wherein the first and second transistors of the differential input stage comprise PMOS field effect transistors (FETs) with source terminals coupled together to the modulation current source, the modulation current source drawing current from the first positive supply rail; with gate terminals comprising data and complementary data inputs; and with drain terminals comprising the first and second output terminals of the differential input stage, respectively;

wherein an anode terminal of the bias diode is connected to the first positive supply rail;

wherein the third transistor comprises a PMOS field effect transistor (FET) with an source terminal coupled to a cathode of the bias diode, with a drain terminal coupled to the second terminal on the termination resistor and with a gate terminal connected to the drain terminal through the feedback resistor, the gate terminal comprising the input of the shunt feedback transimpedance amplifier; and wherein the first and second current source draws current from the ground rail.

3. The DC-coupled driver of claim 2, wherein the VCSEL diode has a cathode terminal connected to the first terminal on the termination resistor and an anode terminal connected to the first positive voltage supply.

4. The DC-coupled driver of claim 2, further comprising
a second operational amplifier having an inverting and a non-inverting input terminal;

a decoupling capacitor connected from an output terminal of the second operational amplifier to the first positive supply rail;

a second feedback resistor connected between the inverting input terminal of the second operational amplifier and the first terminal of the termination resistor; and a bias resistor with a center tap connected between the first positive supply rail and the ground rail, the center tap being connected to the non-inverting input terminal of the second operational amplifier;

wherein the second operational amplifier is supplied from a 3 volt supply; and wherein the VCSEL diode has an anode terminal connected to the output terminal of the second operational amplifier and a cathode terminal connected to the first terminal of the termination resistor.

5. The DC-coupled driver of claim 4, further comprising:
a fourth PMOS field effect transistor with a gate terminal coupled to the gate terminal of the first transistor, with a source terminal coupled to the source terminal of the first transistor and a drain terminal coupled to the drain terminal of the first transistor;

a fifth PMOS field effect transistor with a gate terminal coupled to the gate terminal of the second transistor, with a source terminal coupled to the source terminal of the second transistor and a drain terminal coupled to the ground rail;

wherein the gate width of the fifth transistor is greater than the gate width of the second transistor.

6. The DC-coupled driver of claim 5, wherein the gate width of the fifth transistor is greater than the gate width of the second transistor by a factor of at least 10.

* * * * *